(12) United States Patent
Rumbolt

(10) Patent No.: US 9,047,203 B1
(45) Date of Patent: Jun. 2, 2015

(54) SYSTEMS AND METHODS FOR ENCODING AND DECODING DATA

(71) Applicant: Altera Corporation, San Jose, CA (US)

(72) Inventor: Chuck Rumbolt, St. John's (CA)

(73) Assignee: Altera Corporation, San Jose, CA (US)

( * ) Notice: Subject to any disclaimer, the term of this patent is extended or adjusted under 35 U.S.C. 154(b) by 126 days.

(21) Appl. No.: 13/722,750

(22) Filed: Dec. 20, 2012

Related U.S. Application Data

(60) Provisional application No. 61/578,554, filed on Dec. 21, 2011.

(51) Int. Cl.
*H03M 13/00* (2006.01)
*G06F 11/10* (2006.01)
*H03M 13/15* (2006.01)
*H03M 13/11* (2006.01)

(52) U.S. Cl.
CPC ............ *G06F 11/10* (2013.01); *H03M 13/151* (2013.01); *H03M 13/1102* (2013.01)

(58) Field of Classification Search
None
See application file for complete search history.

(56) References Cited

U.S. PATENT DOCUMENTS

| | | | | |
|---|---|---|---|---|
| 4,520,490 A * | 5/1985 | Wei | ................................ | 375/246 |
| 5,164,963 A * | 11/1992 | Lawrence et al. | ............. | 375/265 |
| 5,168,509 A * | 12/1992 | Nakamura et al. | ............ | 375/286 |
| 5,289,501 A * | 2/1994 | Seshadri et al. | ............... | 375/286 |
| 5,581,481 A * | 12/1996 | Weerackody et al. | ........... | 341/50 |
| 5,734,962 A * | 3/1998 | Hladik et al. | ................. | 455/12.1 |
| 6,031,874 A * | 2/2000 | Chennakeshu et al. | ........ | 375/262 |
| 6,606,718 B1 * | 8/2003 | Bessios | ......................... | 714/701 |
| 6,678,856 B1 * | 1/2004 | Jordan et al. | ................... | 714/755 |
| 7,613,985 B2 * | 11/2009 | Pons et al. | ...................... | 714/774 |
| 7,856,584 B2 * | 12/2010 | Ovchinnikov et al. | ........ | 714/752 |
| 7,958,425 B2 * | 6/2011 | Chugg et al. | ................... | 714/755 |
| 8,209,579 B2 * | 6/2012 | Belogolovy | ................... | 714/752 |
| 8,392,793 B2 * | 3/2013 | Eroz et al. | ...................... | 714/758 |
| 8,418,018 B2 * | 4/2013 | Pons et al. | ...................... | 714/752 |
| 8,621,331 B1 * | 12/2013 | Langhammer | ................ | 714/781 |
| 8,792,469 B2 * | 7/2014 | Yin et al. | ....................... | 370/345 |

* cited by examiner

*Primary Examiner* — Daniel McMahon
(74) *Attorney, Agent, or Firm* — Ropes & Gray LLP

(57) ABSTRACT

Methods and systems for encoding and decoding data using a streaming product-code (SPC). An SPC codeword has a first and second portion in a first and second component stream of the SPC, respectively. The first portion of the first codeword is arranged along a first dimension of the SPC, and the second portion of the first codeword is arranged along a second dimension of the SPC. The SPC efficiently encodes data into a desired target frame format without the overhead of dedicated mapping logic used by product-codes solutions.

18 Claims, 11 Drawing Sheets

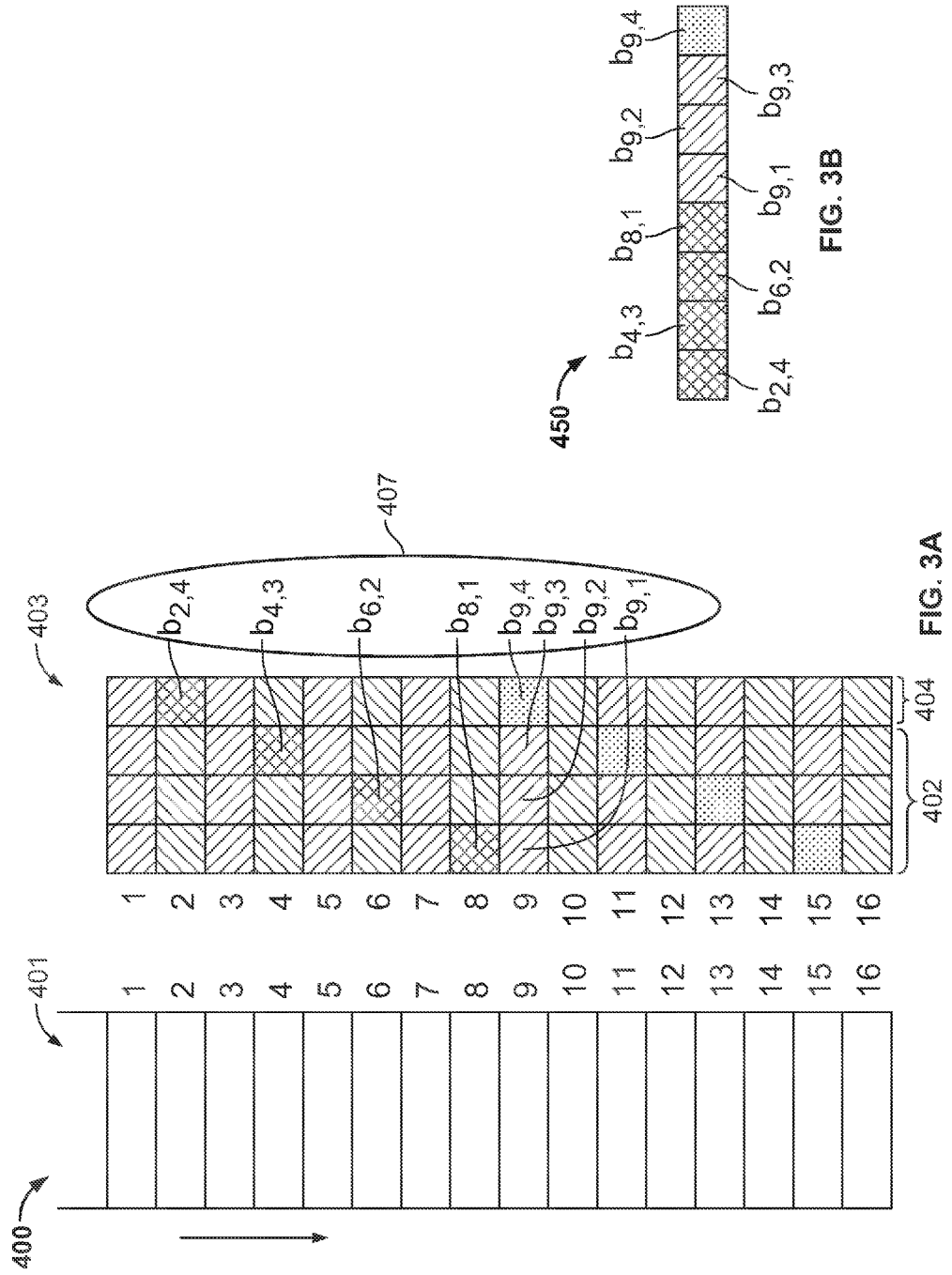

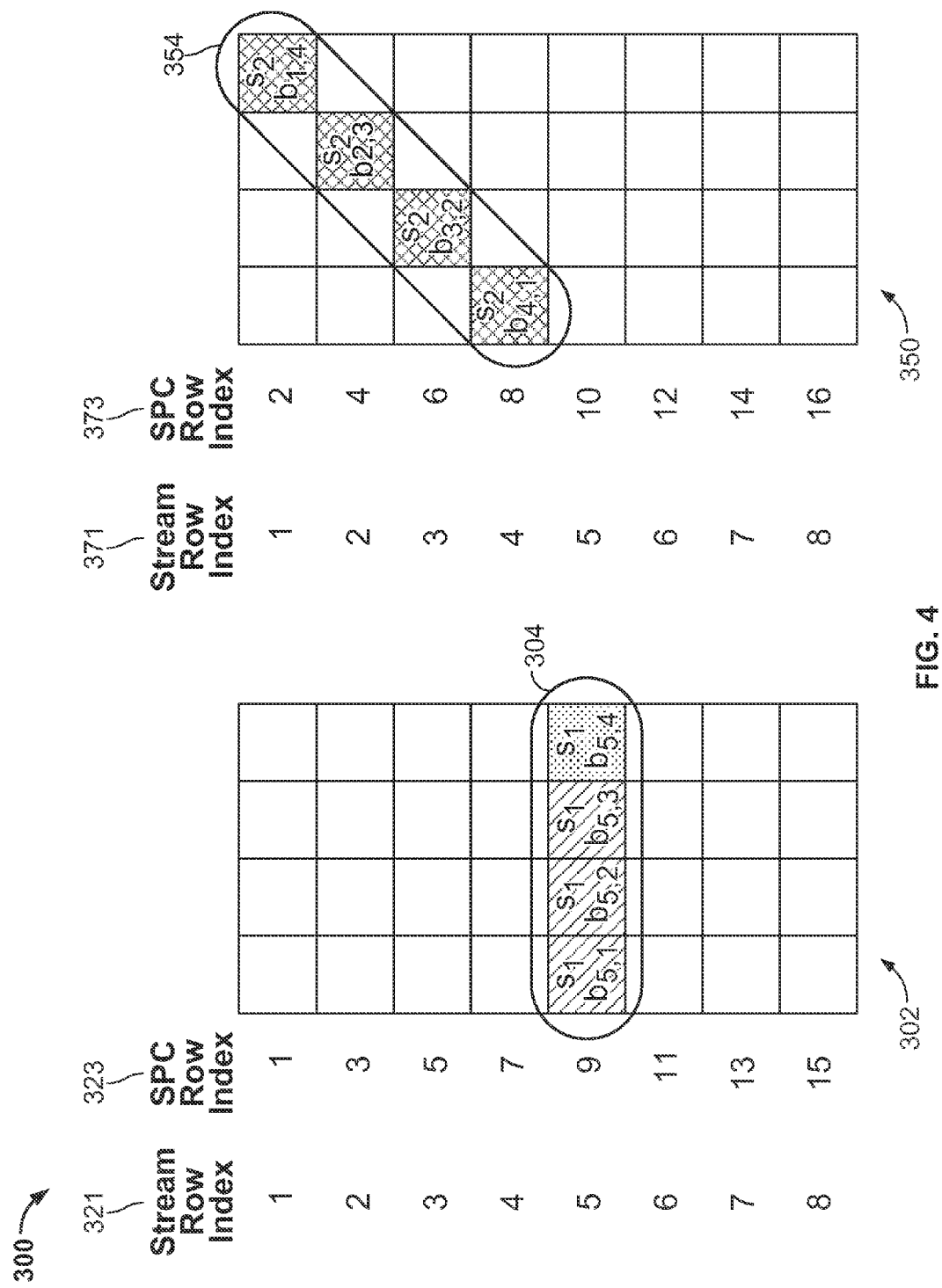

SPC Data Flow
(Encoder)

SPC Data Flow
(Encoder)

SYSTEMS AND METHODS FOR ENCODING AND DECODING DATA

CROSS REFERENCE TO RELATED APPLICATION

This applications claims the benefit of U.S. Provisional Patent Application No. 61/578,554, filed Dec. 21, 2011, which is hereby incorporated by reference herein in its entirety.

FIELD OF THE INVENTION

This disclosure relates to processing streams of data for applications in data communication systems, and particularly to encoding and decoding streams of data.

BACKGROUND OF THE INVENTION

Many transmission systems employ methods for detection of digital data represented by a sequence of symbols. The symbols are transferred as a signal through a communication channel that typically corrupts the transmitted signal with noise. Various error correction schemes may be employed to improve reliability of the transmission. For example, in a forward error correction (FEC) scheme, a transmitter encodes source information by incorporating additional data (or redundancy) based on an error-correction code (ECC). A receiver receives and decodes the encoded data using the same ECC. The redundancy added by the ECC allows the receiver to provide error-correcting functionalities, for example, by eliminating errors in the received signal.

Encoding data with a product-code (PC) and subsequent decoding of the encoded data are employed in many FEC systems because of performance and design advantages (e.g., because of the regular structure of the PC and the resulting high performance gain). A PC is a code constructed from two or more codes, called component codes, which may be combined in an orthogonal manner. In particular, an N-dimensional PC is a code composed of N component codes, where each codeword of the PC can be represented as an N-dimensional array of symbols. In one example, a two-dimensional code includes a source data block, parity checks on the row codewords, parity checks on the column codewords, and checks on the checks. A three-dimensional code may be represented by a cube with three of the six faces being the parity check bits in each dimension.

Customers want encoding (e.g., FEC) solutions to be used in their existing devices to achieve high performance goals. However, schemes that may achieve these high performance goals, e.g., via product-codes (PC) or turbo product-codes (TPC), may not be consistent with the frame formats used for manipulating and/or transmitting data in these existing devices. For example, the structure of a PC may be incompatible with internal data formats used in the existing devices or with standardized data formats used in some commonly used transmission protocols (i.e., transmission framing formats).

Existing systems use two approaches to address this tension between interoperability and performance goals. First, existing system architectures use custom mapper and demapper logic to convert between the FEC data format and the standardized transmission frame format. This solution decouples the transmission framing from the structure used for FEC coding. In one example, an encoder expects incoming data to be formatted according to a standard transmission frame format, leaving the FEC redundancy area (or overhead) void. One example of a standard transmission format is the ITU-T G.975 format for communication through an optical transport network (OTN) fiber. A mapper then maps the incoming data from the standard-compliant frame format to an intermediate FEC format. The FEC encoder then encodes the formatted data. The FEC-encoded data is then demapped back to the standard-compliant frame format and transmitted in that form. This custom mapping/demapping solution is thus compatible with legacy systems, but incurs added complexity, latency, and an increase in logic utilization.

Second, existing systems use a super-frame format such that the same proprietary frame structure is used for transmission and for FEC encoding. This approach, however, makes the system an end-to-end solution because the super-frame is not necessarily interoperable with legacy systems or with transmission standards. This solution may also involve manipulating and transmitting large super-frames, which may incur added complexity, latency, and increased logic utilization.

SUMMARY OF THE INVENTION

This disclosure relates to processing streams of data for applications in data communication systems, and particularly to encoding and decoding streams of data.

In accordance with some embodiments, there are provided methods and systems for encoding data. A first and second component stream of a streaming product-code (SPC) are generated using an encoder. A first SPC codeword has a first and second portions in the first and second streams, respectively. The first portion of the first codeword is arranged along a first dimension of the SPC in the first stream. The second portion of the first codeword is arranged along a second dimension of the SPC in the second stream. The second portion of the first codeword is interleaved with a portion of a second SPC codeword arranged along the first dimension in the first stream.

In accordance with some embodiments, there are provided methods and systems for decoding data. Receiver circuitry is configured for receiving a streaming product-code (SPC) stream, having an interleaving of a first and second component stream, where an SPC codeword has a first and second portion in the first and second streams, respectively. The first portion of the SPC codeword is arranged along a first dimension of the SPC in the first stream, and the second portion of the SPC codeword is arranged along a second dimension of the SPC in the second stream. Processing circuitry is configured for processing the first and second portions of the SPC codeword to generate decoded data.

BRIEF DESCRIPTION OF THE DRAWINGS

Further features will be apparent upon consideration of the following detailed description, taken in conjunction with the accompanying drawings, in which like reference characters refer to like parts throughout, and in which:

FIG. 3A illustrates an exemplary streaming product-code (SPC) according to some embodiments;

FIG. 3B illustrates an exemplary SPC codeword according to some embodiments;

FIG. 4 illustrates an example streaming structure according to some embodiments;

DETAILED DESCRIPTION OF THE INVENTION

This disclosure relates to processing streams of data for applications in data communication systems, and particularly to encoding and decoding streams of data. In applications and devices where information may be altered by interference signals or other phenomena, error-correction codes may provide a measured way to protect information against such interference and to reconstruct information from the transmitted data. As used herein, "information" and "data" refer to any unit or aggregate of energy or signals that contain some meaning or usefulness. Encoding may generally refer to the process of generating data in a manner that facilitates subsequent detection and/or correction of errors in the data. Decoding may generally refer to the counterpart process, i.e., of detecting and/or correcting the errors. For example, decoding may refer to producing an estimate of the transmitted sequence in any suitable form (e.g., a binary sequence, a sequence of probabilities, etc.). The elements of a coding system that perform encoding and decoding are referred to as encoders and decoders, respectively.

Figure 1:
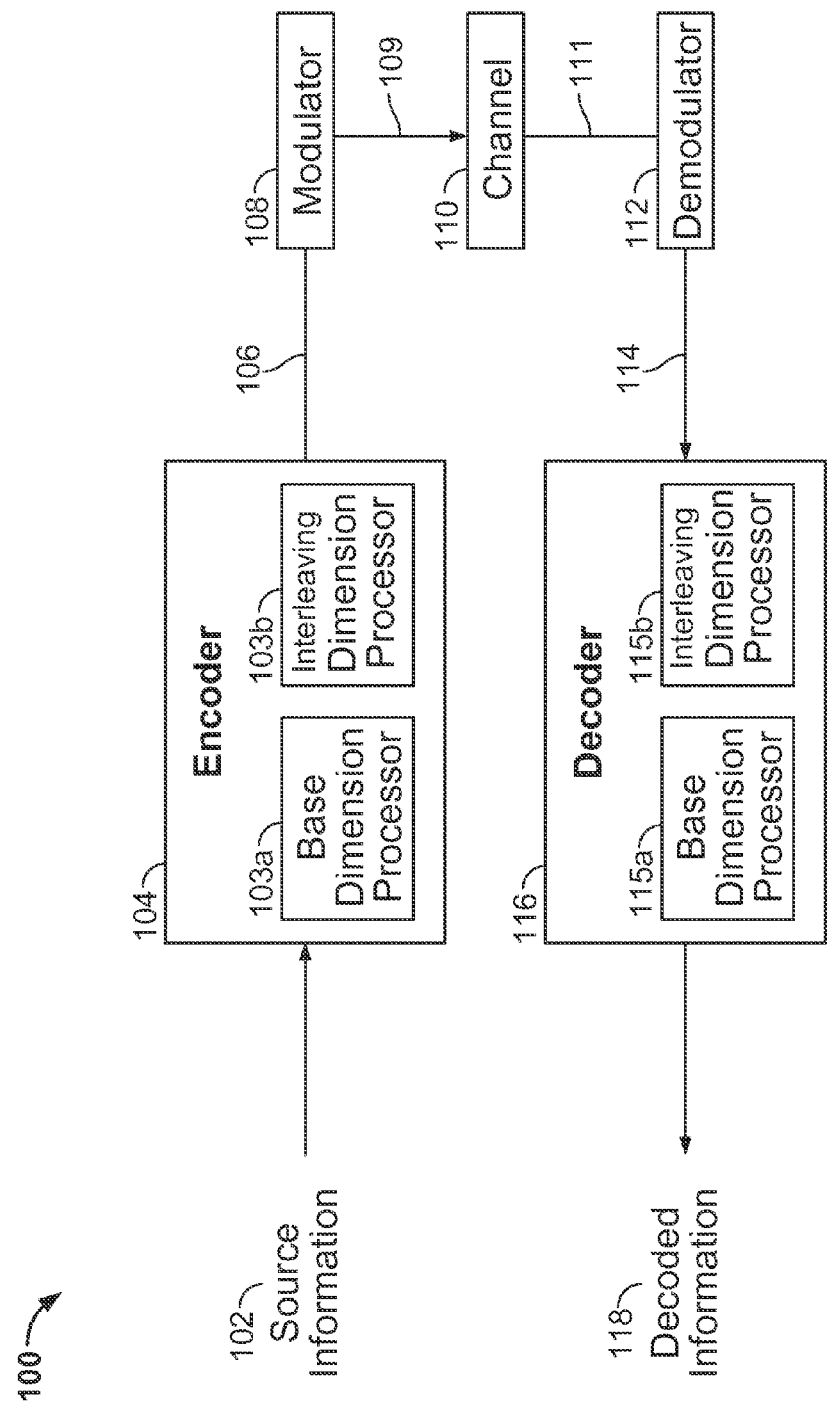
FIG. 1 shows an illustrative communication system that utilizes an error-correction code (ECC) in accordance with some embodiments.

FIG. 1 shows an illustrative communication system 100 that utilizes an error-correction code (ECC) for achieving relatively reliable communication in accordance with some embodiments. Source information 102 is encoded through encoder 104. Source information 102, referred to as the message information, user information, an input data stream, or a message vector, may be grouped into units of k symbols called frames, where each symbol of the frame may be binary, ternary, quaternary, or any other suitable type of data. In the process of encoding source information 102, different codes may be used by encoder 104.

Encoder 104 may encode source information 102 using an error-correction code. The result of encoding source information 102 is one or more data streams 106. In some embodiments, encoder 104 may encode source information 102 based on an N-dimensional product-code to generate N data streams 106. This encoding may be performed using a base dimension processor 103a and an interleaving dimension processor 103b, as will be described in more detail below.

In one implementation, the encoded stream or streams 106 are passed to a modulator 108. Modulator 108 prepares the stream or streams 106 for transmission on channel 110. Modulator 108 may use phase-shift keying, frequency-shift keying, quadrature amplitude modulation, or any suitable modulation technique to modulate streams 106 into one or more information-carrying signals. Channel 110 represents a medium through which the information-carrying signals are communicated and/or stored, as well as events that may physically affect the medium. For example, channel 110 may represent a wired, wireless, optical (e.g., OTN) medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform 111 received by demodulator 112, may be different from the originally transmitted signal waveform 109. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received stream or streams 114 and this result may contain errors due to channel corruption.

Received stream or streams 114 may then be processed by decoder 116. Decoder 116 may be located inside of any suitable device. For example, decoder 116 may be implemented in an integrated circuit and/or a programmable logic device. Decoder 116 may be located inside of a storage device and/or a mobile device. Decoder 116 is used to correct or detect errors in received stream or streams 114 and generate decoded information 118. For example, decoder 116 may detect and/or correct errors produced by encoder 104 or by channel 110.

In some embodiments, decoder 116 may have an interleaving dimension processor 115b and a base dimension processor 115a for decoding the streams generated by encoder 104. Interleaving dimension processor 115b and base dimension processor 115a may operate in parallel, or in sequence in an order arranged opposite to the processing order of interleaving dimension processor 103b and base dimension processor 103a of the encoder 104.

Figure 2:
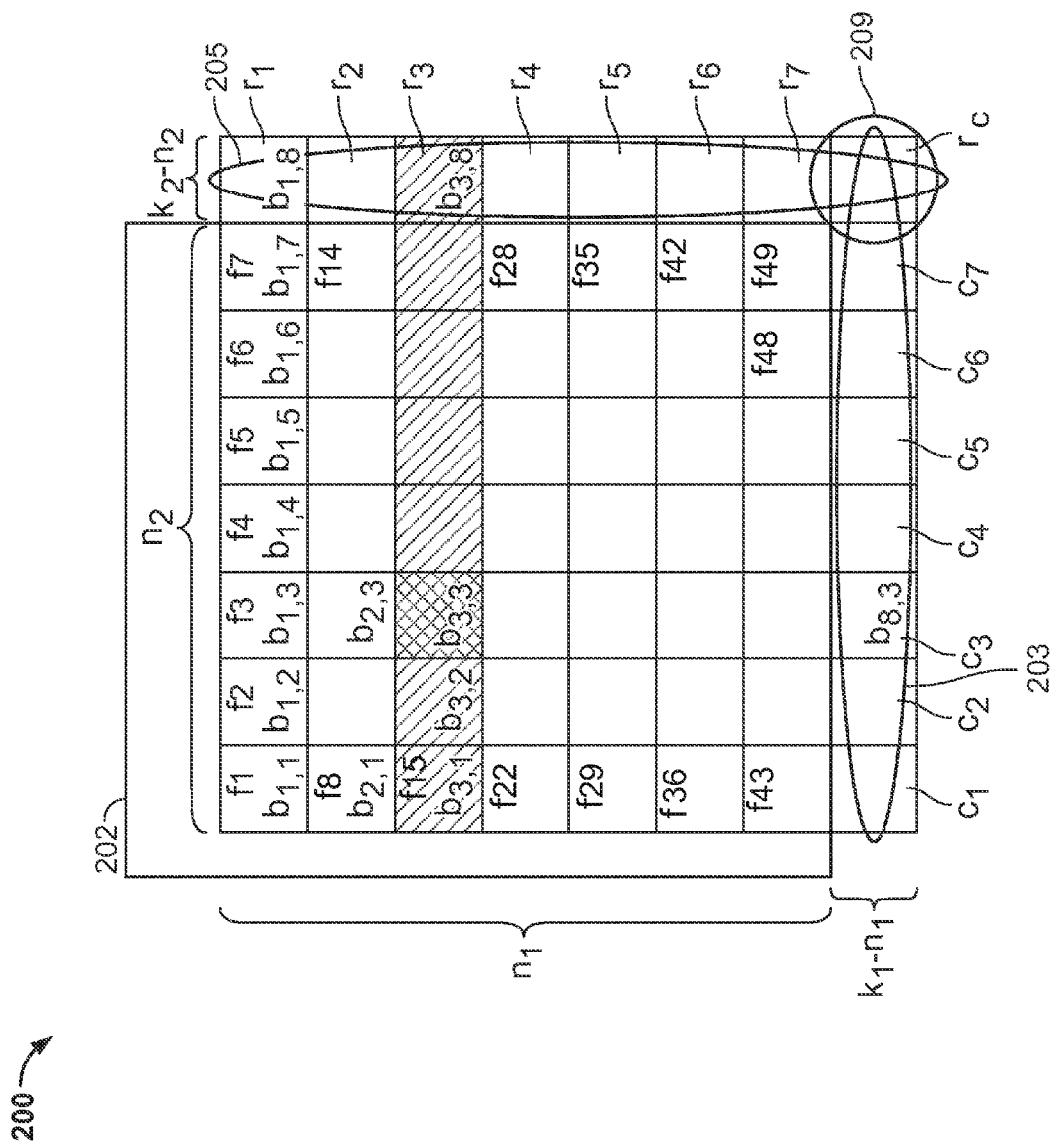
FIG. 2 shows an example two-dimensional product-code (PC) for encoding information according to some embodiments.

FIG. 2 shows an example two-dimensional product-code (PC) 200 for encoding information according to some embodiments (e.g., to encode source information 102 by encoder 104 of FIG. 1). In some embodiments, PC 200 has two component codes, where a component code is a mapping of source information to codewords, each codeword being an ordered collection of symbols from some finite set of symbols along a dimension of the product-code. In some implementations, the component code may combine the information symbols using addition, multiplication, or any linear or non-linear operation to generate one or more parity check symbols. In some implementations, the component codes may correspond to cyclic error-correcting codes, such as BCH and/or Reed-Solomon (RS) block codes.

PC 200 is a k1-by-k2 matrix of blocks $b_{i,j}$ (i≤k1, j≤k2). In this example, k1 and k2 are set to 8. Each block $b_{i,j}$ in PC 200, such as block $b_{1,1}$, corresponds to a data frame. The data frame may be an information frame having source information symbols, for example information frame f1. The data frame may also be a parity frame having parity symbols, such as row parity frame $r_1$. Each frame may contain one or more symbols, for example, frame f1 may include 64 bits.

PC 200 may employ a row parity-bit check code and a column parity-bit check code to encode a number I of source information symbols as two-dimensional codewords. Each codeword represents an array of symbols in a corresponding dimension. For example, PC 200 may have k1 groups of row codewords (k1 row codeword groups), and k2 groups of column codewords (k2 column codeword groups). Each group of codewords may correspond to a frame. The row and column component codes (e.g., parity-bit check codes) may be identical or may be different.

In some implementations, the PC encoding may order the I source information symbols in a submatrix 202 of information symbols, and apply a row by column vector combination to complete the PC 200. For example, the sequence of I source information symbols (e.g., a block of incoming source information 102 of FIG. 1) may be arranged as an n1-by-n2 matrix of information symbols 202. Product-code 200 may be completed by including row-wise symbols 205 and column-wise symbols 203 as error correction information. The component codes may also be applied to the parity symbols 203 and 205 to generate row-column parity symbol or symbols 209.

Although FIG. 2 illustrates a two-dimensional product-code (i.e., N=2), this example is for purpose of illustration, and not for the purpose of limiting the embodiments described. Any appropriate dimension may be chosen. In general, an N-dimensional product-code is a code composed of N component codes, where each codeword of the product-code can be represented as an N-dimensional array of symbols. A codeword of an $i^{th}$ component code associated with a selected dimension is the ordered collection of symbols determined by moving along the selected dimension while keeping the indices of the other dimensions fixed. Each information symbol may be encoded once by each of the N component codes. For example, in the illustrative product-code 200, an information symbol in data frame $b_{3,3}$ is encoded by a column component code to generate a corresponding parity symbol in parity frame $b_{8,3}$ and is encoded by a row component code to generate a corresponding symbol in parity frame $b_{3,8}$.

One way to transmit a PC 200 from an incoming input data stream of information frames [f1, f2, . . . ], is to transmit the information frames as they are encoded, and transmit parity frames as the they become available.

Utilizing product-codes may improve performance and decrease complexity, by increasing gain, decreasing signal-to-noise ratios, employing a simple and regular structure, and leveraging existing knowledge of block codes (e.g., for determining component codes of the PC). However, the product-code structure may be incompatible with existing data formats used by some devices—e.g., with internal data formats used in these devices to manipulate data or with transmission formats used by these devices to transmit data according to certain transmission standards. For example, one common desired transmission format has each transmitted frame followed by its corresponding parity block. This is incompatible with the PC transmission scheme described above, where multiple information frames are first transmitted, followed by an associated parity frame r1, and so on.

Rather than using the customized mapping/demapping approach or the super-frame approach described above to convert between a desired target frame format and the product-code structure, some embodiments of the present disclosure contemplate encoding across a continuous stream of data without having to convert to the PC structure. This may substantially decrease complexity and logic utilization.

FIG. 3A illustrates an exemplary streaming product-code (SPC) 403 according to some embodiments. SPC 403 does not have the rectangular k1-by-k2 matrix structure of PC 200 of FIG. 2. Rather, SPC 403 is encoded across a continuous stream of data 401. Each row in data stream 401 corresponds to an information frame, similar to an incoming data frame from source information 102 of FIG. 1. Frames in data stream 401 may be numbered in the order they arrive at the encoder 104, or any other suitable order. SPC stream codes, such as component codes discussed in context of PC 200 above, may be mapped across the data stream 401 to format encoded data in a desired transmission format without requiring specific mapping logic.

A variable number of codewords that may be encoded in parallel will be referred to herein as a codeword group. The codeword group may involve any range from 1 to k codewords, where integer k may be chosen as an even multiple of a processing internal data path. While it may be easy to conceptualize product-codes as having k1 codeword groups of x row codewords and k2 codeword groups of y column codewords, in practice the internal data path may be wider than x or y, so it may be more efficient to operate in parallel on groups of codewords having more than x or y codewords. However, for the purpose of illustration, the following description will discuss codeword groups as groups of row, diagonal, column codewords, and/or a combination thereof. Moreover, for the purpose of illustration, the number of codewords in a codeword group will correspond to dimensions of a PC such as PC 200 of FIG. 2, or to dimensions of an SPC such as SPC 403 of FIG. 3A. This is meant to be illustrative, not limiting.

Using this codeword group terminology, PC 200 of FIG. 2 can be defined by k1 row codeword groups and k2 column codeword groups. In contrast, SPC 403 may be defined by codeword groups where each codeword covers multiple dimensions, or streams. One such codeword group is illustrated in FIG. 3A as codeword group 407. Specifically, exemplary codeword group 407 includes information blocks $b_{2,4}$, $b_{4,3}$, $b_{6,2}$, and $b_{8,1}$, which map to data from a diagonal portion (or diagonal component stream) of the SPC. Codeword group 407 also includes information blocks $b_{9,1}$, $b_{9,2}$, $b_{9,3}$, which map to data from a row portion (or row component stream) of the SPC. Finally, codeword group 407 includes parity block $b_{9,4}$, which represents parity information for the codeword group 407.

FIG. 3B illustrates an SPC codeword 450, according to some embodiments. SPC codeword 450 belongs to exemplary codeword group 407 of FIG. 2A. For example, SPC codeword 450 has n=7 data blocks and k−n=1 parity block. To the extent that SPC codeword 450 has k1=8 data blocks, of which n1=7 blocks are information blocks and k1−n1=1 block is a parity block, the size and structure of an SPC codeword 450 is analogous to that of a row codeword (and similarly that of a column codeword) in PC 200 of FIG. 2.

The dimensional mapping performed in an SPC may be illustrated in various arrangements. Although any mapping may be sufficient, the simplest two-dimensional SPC arrangement to illustrate and implement will be discussed in FIG. 4 below. This is merely for the purposes of clarity and any other arrangement may be used. It will be understood that component streams may not be generated separately, and that they may be part of one or more SPC structures.

FIG. 4 illustrates an example streaming structure 300 according to some embodiments. Streaming structure 300 includes two SPC component streams 302 and 350 and may be generated using encoding circuitry (e.g., such as base dimension processor 103a and/or interleaving dimension processor 103b of encoder 104 of FIG. 1 above). In the following discussion, two-dimensional PC and SPC (i.e., N=2) will be used as examples. It will be appreciated that this choice is purely for the purposes of illustration and not intended to limit the scope of the present disclosure. Any positive integer N (e.g., N≥2) may be used without departing from the scope of the disclosure.

SPC component streams 302 and 350 may be generated using encoding circuitry, where portions of the component streams along the base dimension are generated using base dimension processor 103a of FIG. 1, and portions of the component streams along a diagonal dimension are generated using interleaving dimension processor 103b of FIG. 1. Rather than mapping each information frame to the k1-by-k2 structure of PC 200, each information frame f1 through f16 of the data stream 401 is mapped to a single dimension for transmission in each of the streams. This single dimension is referred to hereinafter as a common base dimension. For the purposes of illustration, this common base dimension is selected to be the row dimension in the following description. It will be appreciated that other dimensions may be selected as the common base dimension.

Each information frame f1 through f16 of input data stream 401 is mapped to the common base dimension, e.g., the row dimension in each of SPC component streams 302 and 350. For the two-dimensional SPC illustrated in FIG. 4, one relatively easy way to create the two SPC component streams is to alternate frames of the input data stream 401 between the two component streams 302 and 350. For example, frames 1, 3, 5, . . . , 15, as indexed by SPC row index 323, go to stream 302. Similarly, frames 2, 4, 6, . . . , 16, as indexed by SPC row index 372, go to stream 350. A mapping from stream row index 321 of stream 302 to SPC row index 323 of SPC 403 is shown to the left of stream 302. Likewise, a mapping from stream row index 371 of stream 350 to SPC row index 373 of SPC 403 is shown to the left of stream 350.

An SPC codeword may span multiple dimensions, or streams, as shown in FIG. 4. Going back to the example of SPC codeword 450 from FIGS. 3A and 3B, it can be seen that SPC codeword 450 includes data from both component streams 302 and 350 in FIG. 4. For example, blocks $b^{s2}_{1,4}$, $b^{s2}_{2,3}$, $b^{s2}_{3,2}$, and $b^{s2}_{4,1}$ in stream 350 may correspond, respectively, to the first 4 blocks of SPC codeword 450. That is, blocks $b^{s2}_{1,4}$, $b^{s2}_{2,3}$, $b^{s2}_{3,2}$, and $b^{s2}_{4,1}$ in stream 350 may correspond to information blocks $b_{2,4}$, $b_{4,3}$, $b_{6,2}$, and $b_{8,1}$ of SPC 403. Blocks $b^{s1}_{5,1}$, $b^{s1}_{5,2}$, $b^{s1}_{5,2}$, and $b^{s1}_{5,4}$ in stream 302 may correspond, respectively, to the second 4 blocks of SPC codeword 450. That is, blocks $b^{s1}_{5,1}$, $b^{s1}_{5,2}$, and $b^{s1}_{5,3}$ in stream 302 may correspond to information blocks $b_{9,1}$, $b_{9,2}$, and $b_{9,3}$ of SPC codeword 450. In addition, block $b^{s1}_{5,4}$ in stream 302 may correspond to parity block $b_{9,4}$ of SPC codeword 450.

The base stream of an SPC codeword refers to any one of the SPC component streams in which the SPC codeword is represented along the base dimension. For example, SPC codeword 450 has stream 302 as a base stream because SPC codeword 450 is represented along the row dimension in stream 302. Other SPC codewords may have stream 350 as a base stream, i.e., these SPC codewords would be represented along the row dimension in stream 350.

The terminating portion of an SPC codeword (or a group of SPC codewords) is a portion of the base stream of the SPC codeword (or group) that contains the parity information of that SPC codeword (or group). This terminating portion is arranged along the base dimension. In this example, SPC codeword 450 has a terminating row 350 in stream 302, because the terminating row 350 contains the codeword's parity block $b_{9,4}$.

Processing circuitry, such as interleaving dimension processor 103b of FIG. 1, may interleave dimensions other than the common base dimension (i.e., the remaining N−1 dimensions) to each of the N streams. This interleaving may be performed such that the N dimensions intersect at most once, and may operate in a context sensitive manner, i.e., by taking into account the encoding according to the common base dimension. As used herein, interleaving a particular dimension refers to any operation by which data along the particular dimension of the product-code is added to the stream, such that parity information of the stream is updated to take account of the added information. As used herein, intersection between a first and second dimension refers to the first and second dimensions having a common symbol in a product-code or a stream.

In the streaming structure 300, the new streaming code corresponding to an SPC can be seen as a combination of a base part (as generated from encoding information in the common base dimension) and an interleaved part (as generated from the interleaving operation described above).

The generated SPC component streams, e.g., streams 302 and 350 of FIG. 4 may be transmitted separately or in parallel. In some implementations, rows of streams 302 and 350 are transmitted in parallel, e.g., as indicated in the stream row indices 321 and 371 of FIG. 4. In some implementations, the transmit order is alternated between streams 302 and 350 such that a particular number of codewords (e.g., equal number) is sent from each dimension of the product-code in sequence. In this case, a receiver may receive an SPC having alternative ones of the codewords from the N streams, in the order indicated by the SPC row indices 323 and 372 of FIG. 4.

FIG. 5 illustrates an exemplary SPC data flow 500 according to some embodiments. The illustrated data flow is just one exemplary way of mapping input data to an SPC and is shown for the purposes of illustration. Although there is no definite start or end boundaries in the SPC, for the sake of illustration, FIG. 5A begins at row 1, FIG. 5H ends at row 8, and each of FIGS. 5B, 5C, 5D, 5E, 5F, 5G, and 5H correspond to one new frame 2, 3, 4, 5, 6, 7, and 8, respectively, for example, in response to the new frame arriving at the encoder.

In FIG. 5, each row is a protocol frame containing the frame's information and parity. For example, each frame may be a codeword group of k codewords. Each frame is divided into 4 blocks $b_1$, $b_{1,2}$, $b_{1,3}$, and $b_{1,4}$, with each block containing n bits for each of the codeword groups of k codewords. In one example, each frame represents a codeword group of 64 codewords, and each block $b_{1,1}$, $b_{1,2}$, $b_{1,3}$, and $b_{1,4}$ has n=64 bits for each of the 64 codewords, so that each block contains n*k=4096 bits. The frame size is therefore 4n*k=16,384 bits, where 15,360 bits are information bits and 1,024 bits are parity bits.

Figure 5A:
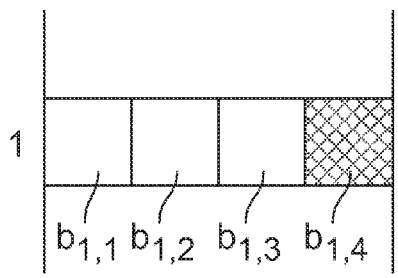
FIGS. 5A, 5B, 5C, 5D, 5E, 5F, 5G, and 5H (referred to collectively herein as FIG. 5) show an exemplary data flow of an SPC in accordance with some embodiments.

Starting from frame 1 in FIG. 5A, a new codeword group G1 is started when frame 1 arrives, and block $b_{1,4}$ is encoded using an encoder such as encoder 104 of FIG. 1. For the purposes of illustration, the SPC data flow will be discussed from the view of this codeword group G1 only. It will be appreciated that other codeword groups may be processed in the same fashion, or any other appropriate fashion, without departing from the scope of the disclosure.

Figure 5B:
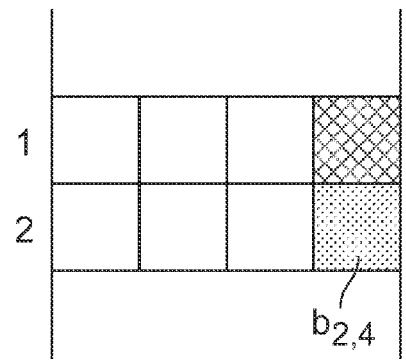
Figure 5C:
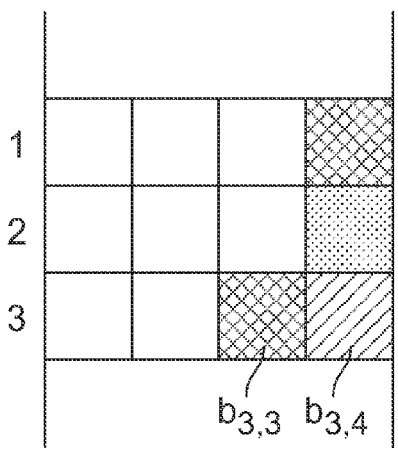
Figure 5D:
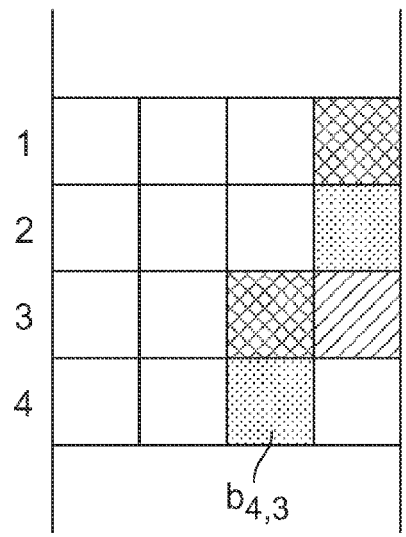
Figure 5E:
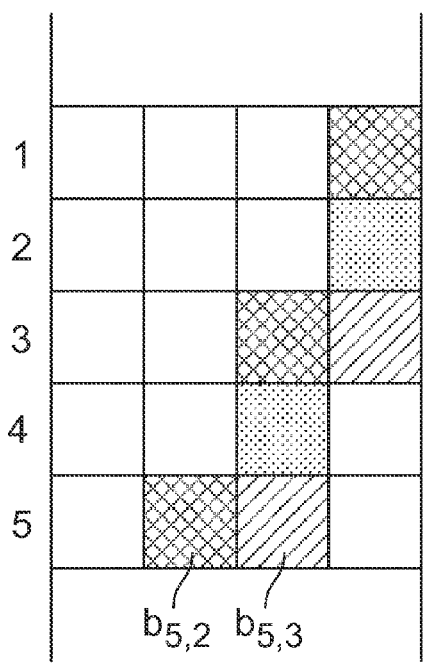
Figure 5F:
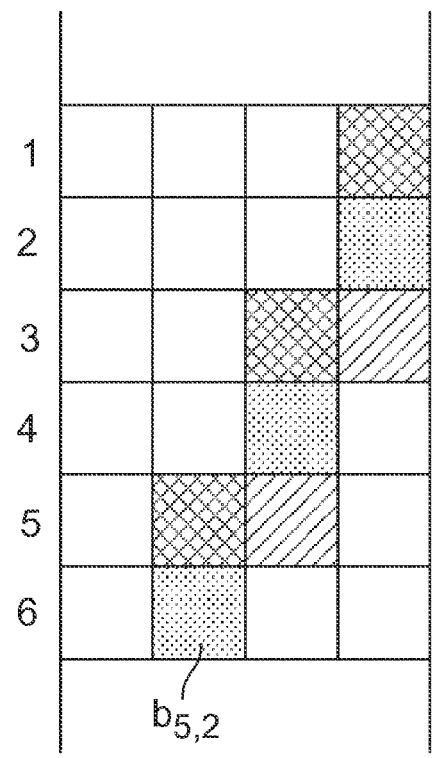
Figure 5G:
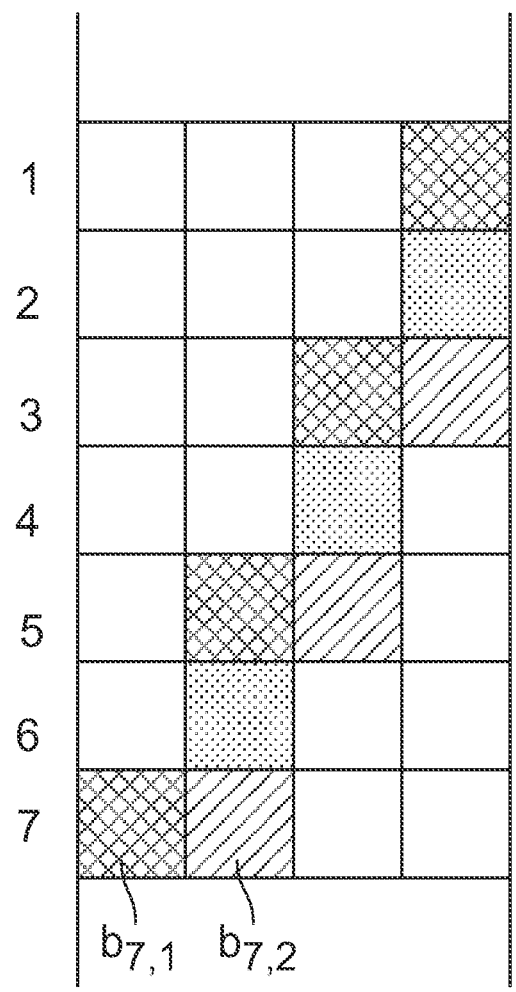

After block $b_{1,4}$ of frame 1 is encoded for codeword group G1, the encoding state for codeword group G1 may be saved while the encoder unit encodes blocks for codeword groups other than G1, for example, while the encoder encodes blocks $b_{2,4}$ of frame 2, $b_{3,4}$ of frame 3, $b_{4,3}$ of frame 4, $b_{5,3}$ of frame 5, $b_{6,2}$ of frame 6, and $b_{7,2}$ of frame 7 (shown in FIGS. 5B, C, D, E, F, and G, respectively). To encode codeword group G1, the process of encoding a data block and saving the encoding state described for frame 1 occurs again for frames 3, 5, and 7, so that the data mapped to the codeword group G1 is encoded and the new encoding state is saved. For example, a first stream encoder unit, such as interleaving dimension processor 103b, may encode blocks $b_{1,4}$ in frame 1, $b_{3,3}$ in frame 3, $b_{5,2}$ in frame 5, and $b_{7,1}$ in frame 7, as illustrated in FIGS. 5A, 5C, 5E, 5G, respectively. These blocks $b_{1,4}$, $b_{3,3}$, $b_{5,2}$, and $b_{7,1}$ are not from the terminating row of the codeword group G1. These blocks are non-terminating blocks and are interleaved along a diagonal direction of the SPC.

Figure 5H:
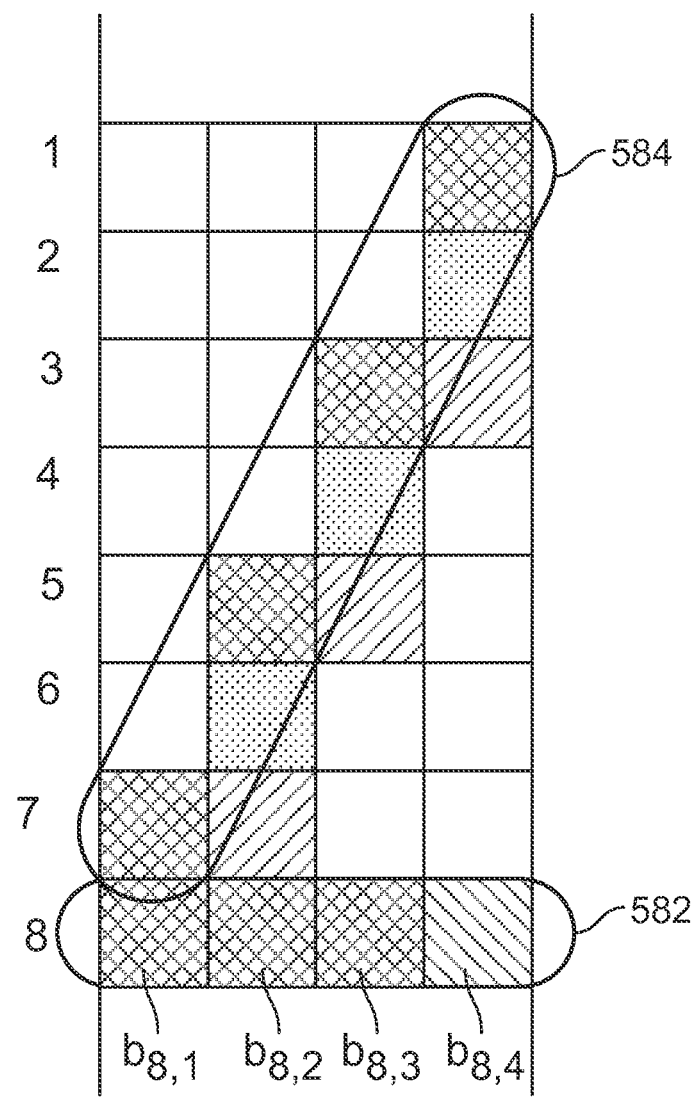

Frame 8, shown in FIG. 5H, is from the base stream of codeword group G1, is arranged along the base dimension, and terminates codeword group G1. The information blocks of frame 8, i.e., blocks $b_{1,4}$, $b_{2,4}$, $b_{3,4}$, are encoded in FIG. 5H. The encoding of terminating frames may be performed in a second stream encoder unit, such as base dimension processor 103a of FIG. 1. The calculated parity information corresponding to frames $b_{1,4}$, $b_{2,4}$, $b_{3,4}$ is placed in parity block $b_{7,1}$ of frame 8.

A new code group G' for another stream may be subsequently generated, starting at block $b_{8,4}$, similarly to how codeword group G1 is generated. As a terminating parity block is calculated, the other stream encoder unit may use the terminating parity block as a first block to encode a new codeword group, and so on. As new codeword groups are added, it can thus be seen that a stream of intersecting codeword groups is formed, along a diagonal direction of the SPC.

Although the described SPC can do away with the rectangular matrix structure of a PC and ensure compatibility with desired frame formats without requiring custom mapping logic, the SPC may still preserve one or more PC characteristics. For example, the SPC may preserve the PC property that every information symbol is covered (i.e., encoded) by exactly N codes. For example, in SPC 403 of FIG. 3A, all information blocks as well as parity blocks are protected.

Furthermore, an SPC may preserve the PC property that any pair of codes from the N codes can intersect at most once. For example, it can be seen from FIG. 5 that each block of codeword group G1 that is mapped to a non-terminating stream (e.g., blocks $b_{1,4}$, $b_{3,3}$, $b_{5,2}$, and $b_{7,1}$ from non-terminating stream 584) overlap a terminating stream such as terminating stream 582 in at most one block (e.g., the intersection of blocks $b_{7,1}$ and $b_{8,1}$). Therefore these two streams 584 and 582 can be interleaved so that a codeword from the non-terminating stream 584 intersects a codeword from the terminating stream 582 in only one symbol (e.g., in only one bit). Similarly, the blocks of the terminating stream will only intersect other codeword groups in the same way, at most once.

The above illustrates only one way to conceptualize an SPC as a 2D arrangement that includes alternative rows from streams 302 and 350 of FIG. 3. For example, odd-numbered rows 1, 3, 5, . . . , 15 of SPC 403 may correspond to stream 302, and even-numbered rows 2, 4, . . . , 16 may correspond to stream 350. Like streams 302 and 305, SPC 403 includes source information symbols (e.g., in columns 402) and parity symbols (e.g., in column 404). The SPC may thus allow mapping input data to protocols that use a data/parity frame structure without implementing dedicated mapping logic.

In one example, code parameters for the SPC may be chosen to allow interleaving into the desired format, without involving additional custom logic that converts between formats. For example, going back to the exemplary frame protocol described in FIG. 5, where the frame size is 16,384 bits, of which 15,360 bits are information bits and 1024 bits are parity bits, a codeword group can be created over this frame that contains 64 codewords. In one implementation, this creates 64 FEC codes that have 240 information bits and 16 parity bits. Accordingly, the frame can be broken into logical blocks that help interleave the multiple streams. For this example, a frame can be divided into four 4096-bit blocks. (This is because it is relatively easy in some implementations to create blocks with sizes equal to the square of the number of codes in a codeword group, in this case 64*64=4096.) As a result, a relatively easy mapping can be created where two component streams of an SPC are generated by having the 64 codewords of one stream intersect the 64 codewords of the other stream in at most 1 bit, and still protect all bits of the generated streams.

The SPC structures described above may stream any multi-dimensional product code and/or turbo product-code (TPC). This may be done without performance degradation relative to conventional PC/TPC implementations. The SPC structures described above are also flexible and can be adapted to suit any desired format (e.g., internal or standardized frames) by choosing code parameters to allow interleaving into the desired format. These SPC structures facilitate a tradeoff between size and latency in some applications. In one example, a certain performance goal, for example achieving a higher-than-9.3 dB gain, may involve a certain amount of processing to generate all needed codes in an iterative algorithm—i.e., a certain number of iterations will result in a certain performance goal. One way to accomplish this is to increase the number of stream processors in the encoder (e.g., similar to base dimension processor or interleaving dimension processors of FIG. 1). This will allow faster performance and decrease latency, but may also increase the FEC's logic size. Another approach is to increase the size of buffering structures used by the encoder. This may allow the system to process the same number of iterations, but at the expense of longer latency and increased memory size.

Figure 6A:
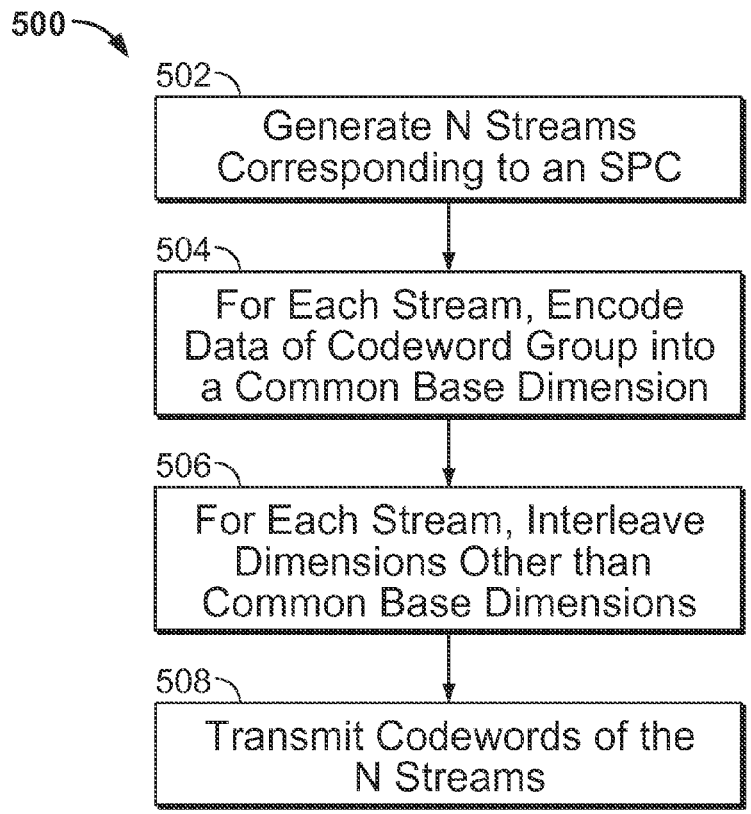
FIG. 6A shows an exemplary flowchart of a process for encoding data in accordance with some embodiments.

FIG. 6A shows an exemplary flowchart of process 500 for encoding data in accordance with some embodiments. Process 500 may be executed by an encoder (e.g., encoder 104 of FIG. 1).

At 502, N component streams are generated that correspond to an SPC. These streams may be similar to SPC component streams 302 and 350 of FIG. 4.

At 504, information symbols from an input information frame are mapped into a common base dimension of each of the streams generated at 502. In some implementations, this may be done by creating a common base dimension code and using a base dimension processor to apply the created code, e.g., similar to base dimension processor 103a of FIG. 1. For example, a first and second stream corresponding to the SPC may be generated along a common base dimension corresponding to the row dimension. A first codeword (which would be arranged in the row dimension of a corresponding PC) is mapped based on the common base dimension into the first stream. A second codeword (which would be arranged in the column dimension of a corresponding PC) is mapped based on the common base dimension into the second stream.

At 506, each of the remaining N−1 dimensions is interleaved to each stream such that one or more properties of the PC are preserved. This may be done using an interleaving dimension processor, such as interleaving dimension processor 103b of FIG. 1. In some implementations, the N−1 dimensions may be interleaved such that the N dimensions intersect at most once. For example, 506 may involve diagonally interleaving a second (non-terminating) stream that intersects a row (non-terminating) stream at most once.

In some implementations, the interleaving of 506 is done by extending the stream component code created at 504 (i.e., the common base dimension code) such that the extended stream component codes from each stream intersect the codes from all other N−1 streams. In this way, each symbol is covered by exactly N stream component codes, and any pair of stream component codes from the N stream component codes intersects at most once. The extended stream component code thus created is a combination of a base portion (generated by the base dimension processor at 504) and an interleaved portion (generated by the interleaving dimension processor at 506).

At 508, codewords from each of the N streams are transmitted. In some implementations, the N streams are transmitted in parallel. In some implementations, the transmission is done in sequence and in a transmit order that alternates between each of the N streams. This may result in an SPC, e.g., similar to SPC 403 of FIG. 3A. An SPC encoding is thus used that can be transmitted using any desired format.

Figure 6B:
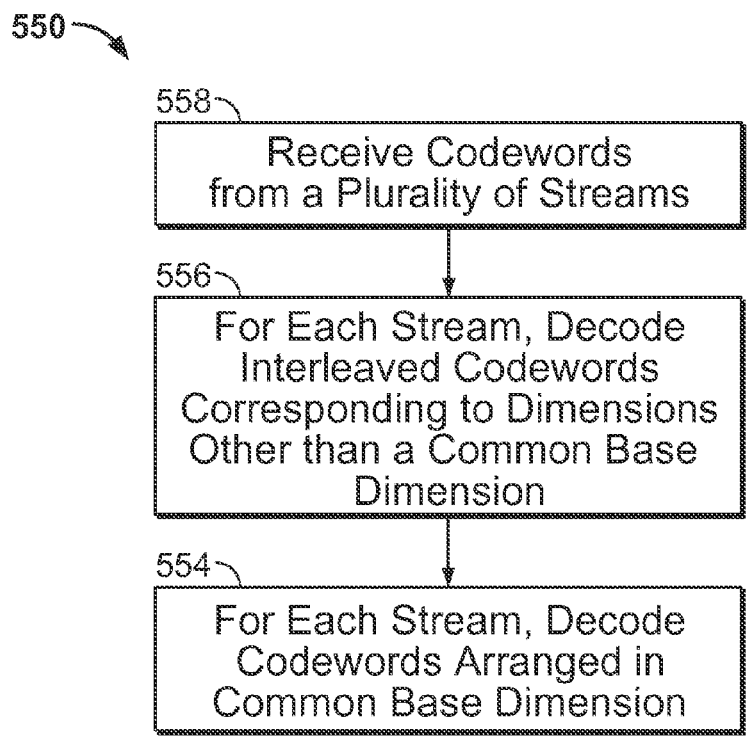
FIG. 6B shows a flowchart of a process for decoding data in accordance with some embodiments.

FIG. 6B shows a flowchart of process 550 for decoding data in accordance with some embodiments. Process 550 may be executed by a decoder (e.g., decoder 116 of FIG. 1).

At 558, codewords are received from each of a plurality of streams, e.g., from the N streams generated at 502 of FIG. 6A. This may be done using receiver circuitry. In some implementations, the N streams are received in parallel. In some implementations, the N streams are received in sequence and in a transmit order that alternates between each of the N streams. For example, at 558, the decoder may receive an SPC, e.g., similar to SPC 403 of FIG. 3A.

At 556, the decoder decodes interleaved codewords that correspond to each of the dimensions of the product-code other than a common base dimension. This decoding may be based on one or more properties of the SPC. An interleaving dimension processor, such as interleaving dimension processor 115b of FIG. 1, may perform this operation. In some implementations, the interleaving dimension processor may decode an interleaved portion of a codeword arranged in a dimension other than a common base dimension in a received stream. For example, the interleaving dimension processor 115b may process diagonal elements of codewords of the received streams to generate decoded information (e.g., similar to decode information 118 of FIG. 1).

At 554, the decoder decodes codewords at least partially arranged along the common base dimension of the product-code to generate decoded information. In some implementations, this may be done using a base dimension processor, e.g., similar to base dimension processor 115a of FIG. 1. For example, the base dimension processor 115a may process row codewords of the received stream to generate decoded data. In some embodiments, both the encoder and decoder are provisioned by the system such that parameters are communicated to the encoder or decoder, either dynamically or as a fixed parameters. In some embodiments, the parameters are built-in.

It will be understood that the above steps of processes 500 and 550 may be executed or performed in any order or sequence not limited to the order and sequence shown and described in the figure. Also, some of the above steps of process 500 and 550 may be executed or performed substantially simultaneously where appropriate or in parallel to reduce latency and processing times. For example, although FIG. 6A shows 504 and 506 in sequence, it should be noted that operations of 504 and 506 may be done in sequence or in parallel, iteratively or in parallel for each of the plurality of streams generated at 502. Furthermore, although FIG. 6B shows 554 and 556 in sequence, it should be noted that operations of 554 and 556 may be done in sequence or in parallel, iteratively or in parallel for each of the plurality of streams received at 558.

The structures described above may be generated in fixed logic, in which case the sizes of the various computational components may be fixed to a particular application. Alternatively, the fixed logic circuitry could allow for limited parameterization.

One potential use for the systems and methods discussed above may be in programmable integrated circuit devices such as programmable logic devices, where programming software can be provided to allow users to configure a programmable device to encode and decode streams of data. One possible result is that fewer logic resources of the programmable device would be consumed than otherwise. And where the programmable device is provided with a certain number of dedicated blocks for arithmetic functions (to spare the user from having to configure arithmetic functions from general-purpose logic), the number of dedicated blocks needed to be provided (which may be provided at the expense of additional general-purpose logic) can be reduced (or sufficient dedicated blocks for more operations, without further reducing the amount of general-purpose logic, can be provided).

Instructions for carrying out a method according to some embodiments for programming a programmable device to encode and/or decode data may be encoded on a machine-readable medium, to be executed by a suitable computer or similar device to implement the method of some embodiments for programming or configuring programmable logic devices (PLDs) or other programmable devices. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 7A:
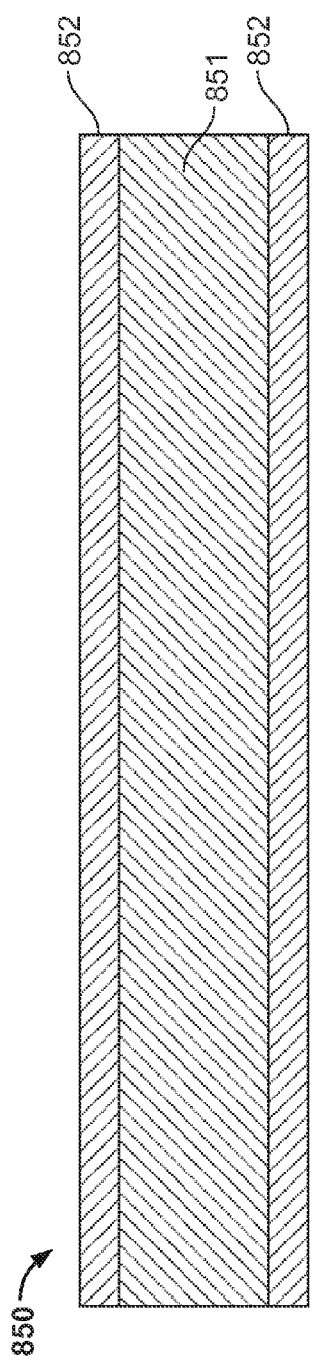
FIG. 7A is a cross-sectional view of a magnetic data storage medium encoded with a set of machine-executable instructions for performing methods according to some embodiments.

FIG. 7A presents a cross section of a magnetic data storage medium 850 which can be encoded with a machine executable program that can be carried out by systems such as the aforementioned personal computer, or other computer or similar device. Medium 850 can be a floppy diskette or hard disk, or magnetic tape, having a suitable substrate 851, which may be conventional, and a suitable coating 852, which may be conventional, on one or both sides, containing magnetic domains (not visible) whose polarity or orientation can be altered magnetically. Except in the case where it is magnetic tape, medium 850 may also have an opening (not shown) for receiving the spindle of a disk drive or other data storage device.

The magnetic domains of coating 852 of medium 850 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with some embodiments.

Figure 7B:
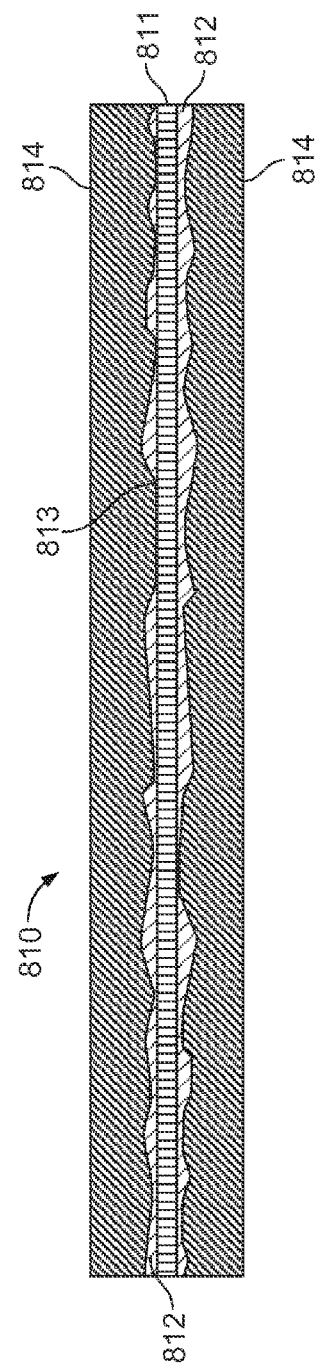
FIG. 7B is a cross-sectional view of an optically readable data storage medium encoded with a set of machine executable instructions for performing methods according to some embodiments.

FIG. 7B shows a cross section of an optically-readable data storage medium 810 which also can be encoded with such a machine-executable program, which can be carried out by systems such as the aforementioned personal computer, or other computer or similar device. Medium 810 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 810 preferably has a suitable substrate 811, which may be conventional, and a suitable coating 812, which may be conventional, usually on one or both sides of substrate 811.

In the case of a CD-based or DVD-based medium, as is well known, coating 812 is reflective and is impressed with a plurality of pits 813, arranged on one or more layers, to encode the machine-executable program. The arrangement of pits is read by reflecting laser light off the surface of coating 812. A protective coating 814, which preferably is substantially transparent, is provided on top of coating 812.

In the case of magneto-optical disk, as is well known, coating 812 has no pits 813, but has a plurality of magnetic domains whose polarity or orientation can be changed magnetically when heated above a certain temperature, as by a laser (not shown). The orientation of the domains can be read by measuring the polarization of laser light reflected from coating 812. The arrangement of the domains encodes the program as described above.

Figure 8:
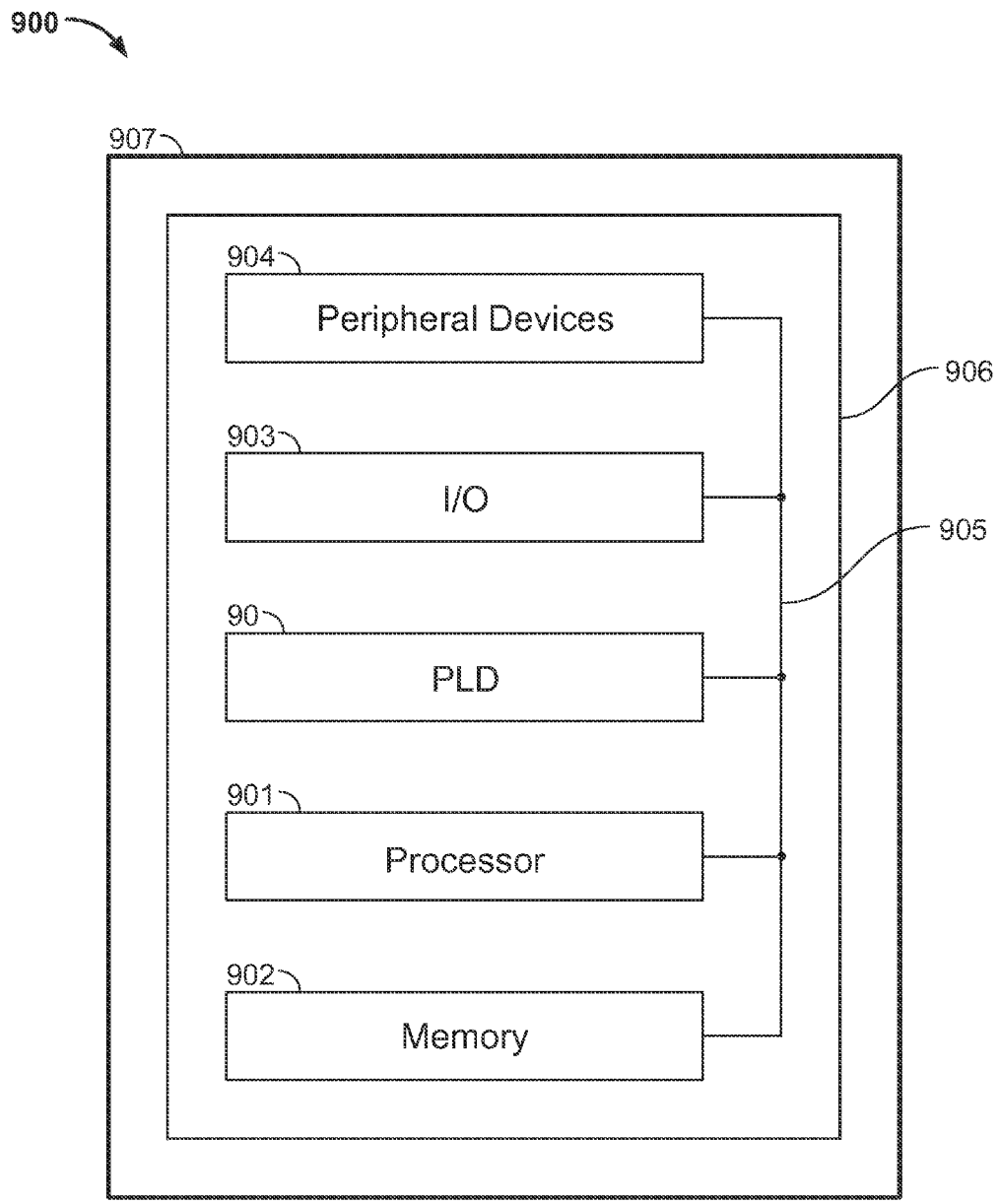
FIG. 8 is a simplified block diagram of an illustrative system employing a programmable logic device incorporating some embodiments.

A PLD 90 programmed according to some embodiments may be used in many kinds of electronic devices. One possible use is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary.

It will be understood that the foregoing is only illustrative, and that various modifications can be made by those skilled in the art without departing from the scope of the disclosure. For example, while an encoder and/or decoder are described with relation to the figures included in the present disclosure, these elements may be replaced by any type of encoders and/or decoders (e.g., any type of Turbo Code encoder/decoder, any type of layered encoder/decoder, or any other type of encoder/decoder). The decoder may also be any variant of these decoders (e.g., a hard encoder/decoder, a bit-flipping decoder, a soft decoder, or any other variant of a decoder). The decoder may make use of either hard information or soft information to decode incoming information. In addition, while certain components of this disclosure have been described as implemented in hardware and others in software, other configurations may be possible. One skilled in the art will appreciate that the present disclosure can be practiced by other than the described embodiments, which are presented for purposes of illustration and not of limitation.

What is claimed is:

1. A method for encoding data, comprising:
    generating, using an encoder, a first and second component streams of a streaming product-code (SPC), wherein a first SPC codeword has a first portion in the first component stream and a second portion in the second component stream, wherein the first portion of the first SPC codeword is arranged along a first dimension of the SPC in the first component stream, and the second portion of the first SPC codeword is arranged along a second dimension of the SPC in the second component stream, wherein the encoder generates the first and second SPC codewords using a forward error correction (FEC) code; and
    interleaving the second portion of the first SPC codeword with a portion of a second SPC codeword arranged along the first dimension in the first component stream.

2. The method for encoding data of claim 1 further comprising interleaving the first and second component streams.

3. The method for encoding data of claim 1, wherein:
    the first SPC codeword intersects the second SPC codeword at most once in the first component stream.

4. The method for encoding data of claim 1, wherein:
    the second portion of the first SPC codeword is arranged along a diagonal of the SPC in the second component stream.

5. The method for encoding data of claim 1, further comprising transmitting the first and second component streams in sequence by alternating a transmit order between the first and second component streams.

6. The method for encoding data of claim 1, further comprising transmitting the first and second component streams by streaming the first and second component streams in parallel.

7. The method for encoding data of claim 1, wherein the generating comprises:
    generating the first component stream using a stream encoder; and
    generating the second component stream using another stream encoder.

8. A system for encoding data, the system configured for:
    generating a first and second stream of a streaming product-code (SPC), wherein a first SPC codeword has a first portion in the first component stream and a second portion in the second component stream, wherein the first portion of the first SPC codeword is arranged along a first dimension of the SPC in the first component stream, and the second portion of the first SPC codeword is arranged along a second dimension of the SPC in the second component stream, wherein the first and second SPC codewords are generated using a forward error correction (FEC) code; and
    interleaving the second portion of the first SPC codeword with a portion of a second SPC codeword arranged along the first dimension in the first component stream.

9. The system for encoding data of claim 8, further configured for interleaving the first and second component streams.

10. The system for encoding data of claim 8, wherein:
    the first SPC codeword intersects the second SPC codeword at most once in the first component stream.

11. The system for encoding data of claim 8, wherein:
    the second portion of the first SPC codeword is arranged along a diagonal of the SPC in the second component stream.

12. The system for encoding data of claim 8, comprising a transmitter for transmitting the first and second component streams in sequence by alternating a transmit order between the first and second component streams.

13. The system for encoding data of claim 8, comprising a transmitter for transmitting the first and second component streams by streaming the first and second component streams in parallel.

14. The system for encoding data of claim 8, comprising:
    a stream encoder for generating the first component stream; and
    another stream encoder for generating the second component stream.

15. A system for decoding data, comprising:
    receiver circuitry for receiving a streaming product-code (SPC) stream, comprising an interleaving of a first and second component stream, wherein an SPC codeword has a first portion in the first component stream and a second portion in the second component stream, wherein the first portion of the SPC codeword is arranged along a first dimension of the SPC in the first component stream, and the second portion of the SPC codeword is arranged along a second dimension of the SPC in the second component stream, wherein the SPC codeword is generated using a forward error correction (FEC) code; and processing circuitry for processing the first and second portions of the SPC codeword to generate decoded data.

16. The system for decoding data of claim 15, wherein the receiver circuitry is configured to receive N streams corresponding to the SPC.

17. The system for decoding data of claim 16, wherein each symbol in the SPC is covered exactly once by each of N component codes in each of the N streams and wherein each pair of component codes from the N component codes intersects at most once in each of the N streams.

18. The system for decoding data of claim 17, wherein each of the N component codes is a forward error correction (FEC) code.

* * * * *